US006835417B2

(12) United States Patent
Saenger et al.

(10) Patent No.: US 6,835,417 B2
(45) Date of Patent: Dec. 28, 2004

(54) METHOD AND DEVICE FOR DEPOSITING THIN LAYERS VIA ALD/CVD PROCESSES IN COMBINATION WITH RAPID THERMAL PROCESSES

(75) Inventors: Annette Saenger, Dresden (DE); Bernhard Sell, Portland, OR (US); Harald Seidl, Feldkirchen (DE); Thomas Hecht, Dresden (DE); Martin Gutsche, Dorfen (DE)

(73) Assignee: Infineon Technologies AG, Munich (DE)

( * ) Notice: Subject to any disclaimer, the term of this patent is extended or adjusted under 35 U.S.C. 154(b) by 120 days.

(21) Appl. No.: 10/375,529

(22) Filed: Feb. 27, 2003

(65) Prior Publication Data

US 2003/0175423 A1 Sep. 18, 2003

(30) Foreign Application Priority Data

Feb. 27, 2002 (DE) .......................................... 102 08 450

(51) Int. Cl.[7] .............................................. C23C 16/00
(52) U.S. Cl. ........................... 427/255.28; 427/255.29; 427/255.392; 427/255.394; 427/314; 427/372.2
(58) Field of Search ..................... 427/255.28, 255.29, 427/255.392, 255.394, 314, 372.2

(56) References Cited

U.S. PATENT DOCUMENTS

| | | |
|---|---|---|
| 4,892,753 A | 1/1990 | Wang et al. |
| 5,935,338 A | 8/1999 | Lei et al. |
| 6,042,652 A | 3/2000 | Hyun et al. |
| 6,174,377 B1 | 1/2001 | Doering et al. |
| 6,310,327 B1 | 10/2001 | Moore et al. |
| 6,384,051 B1 | 5/2002 | Frost et al. |
| 6,573,184 B2 * | 6/2003 | Park .......................... 438/680 |
| 6,579,372 B2 * | 6/2003 | Park .......................... 118/715 |
| 6,592,942 B1 * | 7/2003 | Van Wijck ............. 427/255.34 |
| 6,660,126 B2 * | 12/2003 | Nguyen et al. ........ 156/345.34 |
| 6,673,637 B2 * | 1/2004 | Wack et al. ................... 438/14 |
| 6,730,164 B2 * | 5/2004 | Vaartstra et al. ............ 117/104 |
| 6,746,934 B2 * | 6/2004 | Sandhu et al. .............. 438/428 |
| 6,774,005 B2 * | 8/2004 | Gutsche et al. ............. 438/387 |

FOREIGN PATENT DOCUMENTS

WO    WO 02/070142 A1    9/2002

OTHER PUBLICATIONS

Chang, J. P. et al.: "Rapid Thermal Chemical Vapor Deposition of Zirconium Oxide for Metal–Oxide–Semiconductor Field Effect Transistor Application", J. Vac. Sci. Technol., B 19(5), American Vacuum Society, Sep./Oct. 2001, pp. 1782–1787.

* cited by examiner

Primary Examiner—Bret Chen
(74) Attorney, Agent, or Firm—Laurence A. Greenberg; Werner H. Stemer; Gregory L. Mayback

(57) ABSTRACT

The ALD process chamber has heating radiation sources and the process sequence includes rapid temperature changes on a substrate surface of a substrate arranged in the ALD process chamber. The temperature changes are controlled and the ALD and CVD processes are optimized by in situ temperature steps, for example in order to produce nanolaminates.

13 Claims, 1 Drawing Sheet

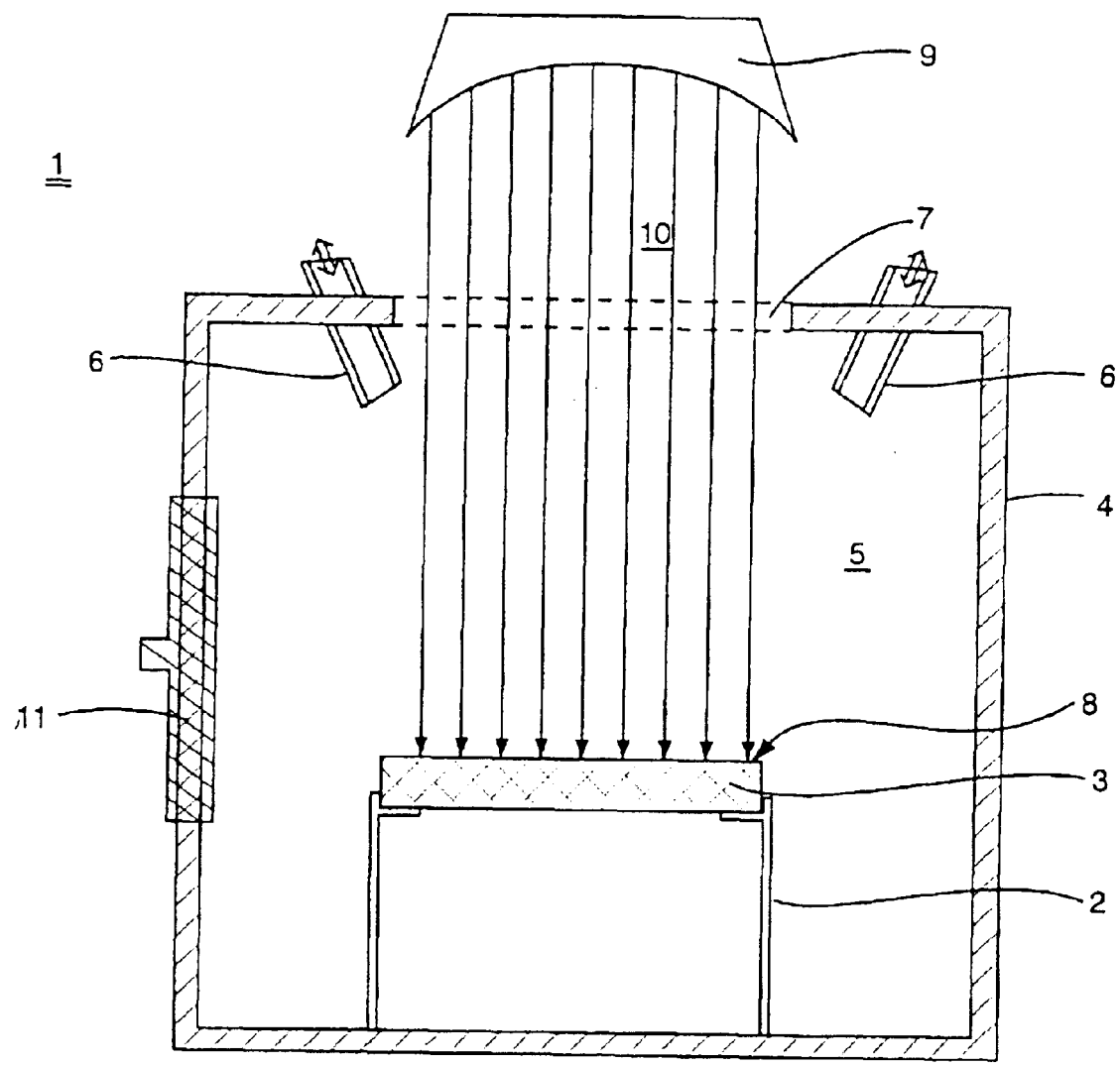

METHOD AND DEVICE FOR DEPOSITING THIN LAYERS VIA ALD/CVD PROCESSES IN COMBINATION WITH RAPID THERMAL PROCESSES

BACKGROUND OF THE INVENTION

Field of the Invention

The invention relates to a method and to a related process chamber for producing a layer made from a layer material on at least sections of a substrate surface of a substrate by sequential deposition of at least two chemical precursor compounds of the layer material from a vapor phase. In each case the system comprises at least a holding device for holding in each case one substrate;

feed and discharge device for the vapor phases of the chemical precursor compounds;

substrate feed device for introducing at least one substrate;

heating source for heating the substrate and/or the substrate surface; and a control device for the sequential introduction of at least two chemical precursor compounds.

The invention specifically relates to processes for depositing layers made from a layer material on at least sections of a substrate surface of a substrate arranged in a chamber interior of a process chamber.

A typical production step involved in the production of micromechanical or microelectronic components is that of producing layers on at least segments of a substrate from various layer materials, then treating and changing the chemical and/or physical properties of the layers which have been deposited, and structuring the layers which have been deposited and changed. The substrate is typically a wafer made from a semiconductor material. A high integration density, as is required in particular for electronic components, such as processors and semiconductor memory devices, requires very small layer thicknesses and small dimensions for structures in the layer. Nowadays, layer thicknesses of a few nanometers and structure dimensions of a few tens of nanometers are customary.

The ongoing miniaturization increases the demands imposed on layer quality. Such layer quality is determined by defect density, roughness, and homogeneity of a layer.

In this context, the term roughness describes a deviation of a surface of a layer from an ideally planar surface. The defect density is a measure of the number and size of impurities or structural defects in the layer. Impurities are in this context inclusions of a material other than the layer material. Examples of structural defects are voids or, in the case of layer materials which form crystals, lattice defects. The term homogeneity relates to a physical and chemical uniformity of the layer.

Standard processes for producing layers with a layer thickness of less than one micrometer on a substrate are epitaxial processes, physical vapor deposition (PVD) and chemical vapor deposition (CVD) processes.

In CVD processes, a substrate that is placed in a CVD process chamber is exposed to a flow of one or more process gases. The process gases are, by way of example, gaseous chemical precursor compounds of the layer material or inert carrier gases which convey the precursor compounds in solid or liquid form. In the CVD process chamber and/or above the substrate surface, the layer material is produced photolytically, thermally and/or with plasma enhancement from the precursor compound(s) (also referred to below as precursors), and is deposited on the substrate surface and forms a layer. The deposition generally takes place either at atmospheric pressure or at subatmospheric pressure. A CVD process chamber in which deposition processes at subatmospheric pressure are possible is described in U.S. Pat. No. 5,935,338 (Lei et al., Applied Materials Inc.).

Since the deposition is closely linked to the supply of the precursors and therefore to the flow of the process gases, deposition of a homogeneous layer of uniform thickness requires complex and expensive CVD process chambers as well as precise process control.

A further drawback of CVD processes is poor edge coverage. On a structured substrate surface which has recesses with flanks which are vertical with respect to the substrate surface, the edge coverage represents a measure of the extent to which the layer material is deposited at the flanks at the upper end of the recess, facing the surface, and at the flanks at the lower end of the recess, facing the base of the recess.

The fact that both the precursors and the layer material as it were coexist in the immediate vicinity of the substrate surface furthermore results, during the deposition, in inclusions of the precursors in the layer which is being deposited and therefore in a defect density which is inherent to the process in the layer which has been deposited.

After a layer has been deposited, it may be necessary, prior to the structuring of the layer or prior to the application of a further layer, to carry out a temperature step. This temperature step may involve either heating or cooling, as a result of which, for example, layer materials are set, diffusion or implantation operations are stopped, thermomechanical stresses in the layer are reduced and the chemical composition is homogenized (annealing).

Processes which include a generally rapid, brief heating or cooling of a substrate are collectively known by the term RTP (rapid thermal processing) processes. RTP processes are also used to oxidize and nitride layers. There are usually dedicated RTP reactors available for RTP processes, as are known, for example, from U.S. Pat. No. 6,310,327 (Moore et al,). Such RTP reactors are equipped with radiation sources inside or outside a process chamber, by means of which rapid temperature changes on a substrate surface arranged in the process chamber are controlled. A drawback of combining CVD processes in CVD process chambers with RTP processors in RTP reactors is the difficulty of transferring the substrates between the CVD process chamber and RTP reactor. Each transfer increases the likelihood of the substrate surface being contaminated and in this context entails considerable set-up outlay and downtimes on installations in question.

Therefore, RTCVD installations (RTCVD: rapid thermal chemical vapor deposition) are also known, for example from U.S. Pat. No. 4,892,753 (Wang et al.) or U.S. Pat. No. 5,935,338 (Lei et al., Applied Materials), in which CVD process chambers are equipped with rapidly heating radiation sources which are known from RTP reactors. RTCVD installations of this type firstly in principle allow RTP and CVD processes to be carried out in a single process chamber. Furthermore, CVD processes can be improved in RTCVD installations. Rapid heating of the substrate surface acts as a reactive switch and allows very greatly improved process control and shorter deposition times.

However, RTCVD installations of this type have a number of drawbacks. For example, in standard CVD and RTCVD processes, the reaction products of the vapor phase deposition are deposited not on the substrate surface but rather also on the inner sides of a chamber wall, which surrounds a chamber interior of the process chamber. If, as a result, the temperature in the process chamber changes considerably, the materials of the chamber wall and the deposited layer material expand to different extents, with the result that the material which has been deposited on the inner wall flakes off and contaminates the process chamber with particles. Once they have been deposited on the substrate surface, these particles increase the defect density in the layer that has just been deposited.

A further drawback results in connection with the radiation sources. In RTCVD reactors, the radiation sources may, in principle be arranged inside or outside the process chamber. Arranging the radiation sources outside the RTCVD reactor requires the chamber wall to be transparent at least in sections. To prevent deposition of the reaction products on the inner side of transparent sections (windows) of the chamber wall, complex cooling of the windows is required. An example of a cooled window for RTCVD process chambers is described in U.S. Pat. No. 6,384,051 (Fidelmann). Furthermore, layers which have been deposited on the chamber walls in CVD process chambers are regularly removed by purging with etching gases. If the deposited layer materials are dielectrics, the etchants which are suitable for this purpose also etch a material of the windows, usually a quartz glass or sapphire glass, and change the optical properties of this material. In RTCVD process chambers which are currently customary, the windows are changed or cleaned in a complex way after approximately 1000–2000 cycles.

A further drawback is the fact that the layer thickness of a layer which is deposited is dependent on the temperature on the substrate surface. In the case of substrate diameters of 300 mm, a uniform layer thickness also requires very uniform irradiation of a structured substrate surface. Uniform irradiation of a substrate surface of this type by means of standard radiation sources, for example tungsten halogen lamps, requires complex optical radiation guidance and a virtually flawless and deposition-free window.

A further difficulty with a combination of RTP and CVD processes in one installation consists in the fact that the substrate resting on a support represents an obstacle to a rapid temperature reaction of the substrate. However, if the back surface of the substrate is uncovered, the back surface of the substrate is also subject to vapor deposition, which is undesirable there.

In current designs of CVD process chambers, as are described, for example, in U.S. Pat. No. 5,935,338 (Lei et al.), therefore, there has been a movement away from the concept of rapid heating of the substrate toward more uniform heating of the substrate or of the substrate surface.

A further variant of the CVD process is the sequential CVD process or ALD process (ALD, atomic layer deposition).

In ALD processes, in a first phase a first chemical precursor compound is introduced into a process chamber in which a substrate is present. A process known as chemisorption causes the first precursor to be deposited only in intended (activated) sections of the substrate surface. In the process, the first precursor is generally modified. When all the activated sections have been covered with the modified precursor, the first phase of the deposition has ended.

Then, a monomolecular partial monolayer comprising a modified precursor has been deposited on the substrate surface. In a second step, undeposited fractions of the first precursor are removed from the process chamber. The removal is effected by purging with an inert gas and/or by these fractions being pumped out. Then, in a third step, a second precursor is introduced into the process chamber and is deposited on the first, the precursors being converted into the layer material and forming a monolayer of the layer which is to be produced. In a fourth step, undeposited fractions of the second precursor are removed from the process chamber. Steps 1 to 4 are repeated until a layer of predetermined layer density has been formed from the monolayers deposited in this way.

On account of its self-limiting character, ALD deposition is independent of a quantity of the precursors introduced, their incoming flow characteristics and also diffusion and reaction dynamics of the precursors. Consequently, the technical demands imposed on both an ALD process chamber and the control of an ALD process are reduced. Since the deposition of the precursors is controlled substantially by chemisorption but not by dynamic, diffusion-determined processes, ALD processes result in very good edge coverage for deposition on nonplanar, structured substrate surfaces.

Drawbacks of standard ALD processes and ALD process chambers are in particular the low substrate throughput. A further drawback is the fact that, on account of the heating of the substrate surface usually being slow, temperature steps, for example for surface activation or for annealing, have to be carried out either with the need to accept long process times in the ALD process chamber or with complex set-up precautions in an RTP chamber, for example.

U.S. Pat. No. 6,174,377 (Doering et al., Genus Inc.) describes an ALD process station for increasing the substrate throughput, in which a plurality of ALD process chambers are economically arranged and operated in parallel.

U.S. Pat. No. 6,042,652 (Hyun et al., PK Ltd) describes an ALD process chamber which, in order to increase the substrate throughput, makes it possible for a plurality of substrates to be arranged and processed simultaneously in a single process chamber.

Both patents combat the lower throughput of an ALD process chamber, which is lower than that of CVD process chambers by approximately a factor of 10, by using a higher degree of parallelism.

However, all currently known ALD process chambers and installations have the drawback of a long process time per substrate compared to conventional CVD processes as well as the lack of possibilities for rapidly changing the temperature of a substrate arranged in the process chamber or the substrate surface in order to achieve a wider range of applications for ALD processes.

SUMMARY OF THE INVENTION

It is accordingly an object of the invention to provide a device and a method for depositing thin layers with ALD/CVD processes in connection with rapid thermal processes which overcomes the above-mentioned disadvantages of the heretofore-known devices and methods of this general type and which provides for a process chamber that shortens the time required to process a substrate during an ALD process and which increases the variability of the processes for deposition of thin layers which can be carried out in the process chamber. The specific objects to be achieved by the novel process, as compared to conventional ALD processes, are to increase the speed at which a layer is deposited in an ALD process and/or to improve the quality of a layer deposited in an ALD process.

With the foregoing and other objects in view there is provided, in accordance with the invention, a method of depositing a layer material on a substrate surface. The novel method comprises the following method steps:

(a) introducing a first chemical precursor compound of the layer material in vapor phase into a process chamber, depositing and chemically bonding a first fraction of the first chemical precursor compound on the substrate surface at least in sections to form a monomolecular partial monolayer;

(b) removing undeposited second fractions of the first chemical precursor compound from the process chamber;

(c) introducing a second chemical precursor compound of the layer material in vapor phase into the process chamber, depositing and chemically bonding a first fraction of the second chemical precursor compound on the sections of the substrate surface covered by the first chemical precursor compound, and thereby forming a monolayer comprising the layer material of the first and second chemical precursor compounds; and (d) removing undeposited second fractions of the second chemical precursor compound from the process chamber;

and thereby:

repeating steps (a) to (d) to produce a layer from successive monolayers;

subjecting the substrate surface to at least one temperature change with a gradient of greater than 100 Kelvin per second in the process chamber selectively before, during, and/or after at least one process step;

heating and activating the substrate surface by a rapid and brief increase in the temperature prior to depositing a chemical precursor compound, subsequently reducing a temperature of the substrate surface and depositing the chemical precursor compound on the activated substrate surface.

In accordance with an added feature of the invention, the method comprises:

introducing and depositing the first chemical precursor compound at a first temperature of the substrate surface; and introducing and depositing the second chemical precursor compound at a second temperature of the substrate surface different from the first temperature.

In accordance with an additional feature of the invention, the undeposited second fractions of at least one of the first and second chemical precursor compounds are removed by purging the process chamber with the respectively other chemical precursor compound at a temperature TA at which the other chemical precursor compound is inert.

In accordance with another feature of the invention, the temperature TA is kept equal to the first or second temperature at which in each case the other chemical precursor compound is introduced and deposited.

In accordance with a further feature of the invention, the step of introducing and depositing at least one of the first and second chemical precursor compounds comprises the following steps:

(a) establishing a nucleation temperature TN on the substrate surface;

(b) depositing first sections of the chemical precursor compound in a nucleation step;

(c) reducing the temperature on the substrate surface to above a minimum completion temperature TK; and (d) depositing second sections of the precursor compound.

In accordance with again an added feature of the invention, after depositing a layer comprising one monolayer or a plurality of monolayers, the substrate surface is briefly heated by a rapid temperature change, to thereby change a chemical and/or physical structure of the layer.

In accordance with again an additional feature of the invention, the layer is formed of tungsten nitride. For that purpose, the method comprises introducing tungsten hexafluoride into the process chamber as the first chemical precursor compound of tungsten nitride, and introducing ammonia into the process chamber as the second chemical precursor compound. Preferably, the temperature on the substrate surface during the introduction and deposition of the tungsten hexafluoride and of the ammonia is set to 400° C. (±10%), and the chemical and/or physical structure of one monolayer or a plurality of monolayers is changed by setting the temperature to at least 800° C. for at least 15 and at most 120 seconds, and thereby changing the temperature with a gradient of greater than 100 Kelvin per second.

In accordance with yet an added feature of the invention, impurities formed in a chamber interior of the process chamber during the production of the layers are thermally decomposed by a rapid and brief increase in the temperature and then the impurities are removed from the process chamber.

In accordance with yet another feature of the invention, a plurality of successive layers each comprising one of at least two different layer materials are deposited, and the various layer materials are deposited at different temperatures on the substrate surface.

Specifically, the first layer material deposited is $HfO_2$ at a temperature of substantially 500° C. (±10%) from the precursor compounds $HfCl_4$ and $K_2O$, and the second layer material deposited is $SiO_2$ at a temperature of substantially 427° C. (±10%) from the precursor compounds $SiCl_4$ and $H_2O$. This results in the production of a nanolaminate, formed from successive layers of $HfO_2$ and $SiO_2$.

The process is advantageously performed in a process chamber that allows producing a layer made from a layer material on at least sections of a substrate surface of a substrate by sequential deposition of at least two chemical precursor compounds of the layer material from a vapor phase. The process reactor comprises:

a holding device for holding in each case at least one substrate, feed and discharge device for the vapor phases of the chemical precursor compounds, substrate feed device for introducing the substrate into the process chamber heating source for heating the substrate and/or the substrate surfaces and a control device for sequential introduction of at least two chemical precursor compounds, and at least one heating source is a radiation source, by means of which a temperature of the substrate and/or of the substrate surface can be changed with a gradient of greater than 100 Kelvin per second.

With a process chamber of the type according to the invention, it is possible to increase the throughput of substrates per ALD process chamber, to widen the range of applications of ALD processes and to optimize the deposition of thin layers by combining the actual deposition with at least one RTP step (RTP: rapid thermal processing).

Suitable radiation sources are preferably tungsten halogen heating lamps which are known from standard RTP or RTCVD process chambers. Temperatures of over 1000° C. on the substrate surface can be achieved using tungsten halogen heating lamps. Moreover, with tungsten halogen heating lams it is possible to achieve temperature gradients of greater than 100 Kelvin per second, with the result that ALD processes can be made particularly fast and variable.

The process chamber of the type according to the invention differs from prior RTCVD process chambers in terms of the form of a process control device which controls the supply and discharge of the process gases. The feed and discharge devices themselves can be made more simple, since the flow and diffusion kinematics of the process gases influence the deposition process to a very much lesser extent. On the other hand, the demands imposed on the service life of switchable valve devices arranged in the feed and discharge devices are significantly higher, since they are actuated considerably more frequently to deposit just a single layer than is the case in conventional RTCVD process chambers. Moreover, the valve devices have to be provided with a significantly shorter specified maximum switching time for the "open/closed" transitions and vice versa.

A significant benefit of a process chamber of this type (RTALD process chamber) results from the fact that layer thicknesses which are usually achieved with ALD processes are very small, i.e. on the one hand a very small quantity of material is reacted in the process chamber and on the other hand the material in the process chamber is deposited highly selectively on the substrate surface. This results in a low level of contamination of the inner side of the chamber wall or of components of the process chamber arranged in the interior of the chamber compared to RTCVD process chambers.

For example, if, in a preferred embodiment of the invention, the radiation source is arranged inside the ALD process chamber, in all processes in which the deposition of the chemical precursor compounds takes place selectively on an activated substrate surface or on top of one another, the surface of the radiation source remains substantially free of deposits. There is essentially no need for complex cleaning of the radiation source.

According to a further preferred embodiment of the invention, the radiation sources are arranged outside the process chamber. In this case, a chamber wall which surrounds a chamber interior has a section which is oriented toward the radiation source and is transparent to the heating radiation from the radiation source. In this arrangement, there is no need for the process chamber to be opened when the radiation sources are being replaced for maintenance purposes.

The transparent section of the chamber wall preferably has a cooling device which cools the transparent section while the process chamber is operating and prevents deposition processes and chemical reactions on a surface of the transparent section which faces the chamber interior. Providing the cooling device further reduces the maintenance outlay required for the process chamber.

A process chamber of the type according to the invention, compared to standard ALD process chambers, allows rapid temperature changes before, during and/or after an ALD process within a wide temperature range.

Returning once more to the novel process, the object is achieved by a process for depositing at least one layer comprising in each case one layer material on at least sections of a substrate surface of a substrate arranged in a chamber interior of a process chamber. The method, as noted above, comprises at least the process steps of:

(a) introducing a first chemical precursor compound of the layer material into the process chamber in a vapor phase, a first fraction of the first chemical precursor compound being deposited uniformly and chemically bonded on the substrate surface at least in sections as a monomolecular partial monolayer, (b) removing undeposited second fractions of the first chemical precursor compound from the process chamber, (c) introducing a second chemical precursor compound of the layer material into the process chamber in a vapor phase, a first fraction of the second chemical precursor compound being deposited and chemically bonded on the sections of the substrate surface which are covered by the first chemical precursor compound, and in the process a monolayer comprising the layer material being formed from these two chemical precursor compounds, and (d) removing undeposited second fractions of the second chemical precursor compound from the process chamber, in which method a layer is produced from successive monolayers by repeating process steps (a) to (d), and during and/or after at least one process step, at least one temperature change with a gradient of greater than 100 Kelvin per second is carried out on the substrate surface in the process chamber.

For some chemical precursor compounds, a temperature range in which deposition can take place on the substrate surface is greatly limited. On the one hand, it is necessary for the temperature of the substrate surface to be above a minimum temperature at which the deposition of the chemical precursor compound can actually take place. Also, the removal of excess fractions of the chemical precursor compound from the process chamber requires a minimum mobility and therefore a minimum-temperature in the process chamber. On the other hand, the deposition of a chemical precursor compound only remains self-limiting if the temperature on the substrate surface does not exceed a maximum temperature which is specific to the reaction. For example, if one chemical precursor compound is an organic compound, if the maximum temperature is exceeded the chemical precursor compound decomposes prematurely on the substrate surface as a result of the temperature. In a process of the type according to the invention, the temperature on the substrate surface is now regulated sufficiently quickly and accurately in such a manner that each substep of an ALD process takes place at an optimum temperature or within an optimum temperature range.

Therefore, the process according to the invention also makes it possible to utilize chemical precursor compounds of different reactivity during an ALD process within a process chamber. A range of materials and material combinations which are suitable for ALD processes is significantly widened. By way of example, it is in this way possible to produce nanolaminates from $HfO_2$ and $SiO_2$ in the same process chamber.

In a preferred embodiment of the invention, the removal of the undeposited fractions of at least one of the two chemical precursor compounds is effected by purging the process chamber with in each case the other chemical precursor compound at a temperature at which the other chemical precursor compound is inert. The purging is effected by displacing the one precursor compound by means of the other precursor compound, it also being possible for the displacement to be assisted by pressure changes in the process chamber. Then, the temperature on the substrate surface is controlled within a temperature range in which the other chemical precursor compound becomes chemically reactive. Since the temperature change takes place significantly more quickly than purging of the process chamber with, for example, a chemically inert gas, as in ALD processes of the standard type, in this way an ALD process in the process chamber is significantly accelerated.

This process is particularly advantageous if a temperature TA at which one chemical precursor compound is removed from the process chamber by means of the other chemical precursor compound by purging is equal or similar to the temperature at which the deposition of the one chemical precursor compound on the substrate surface takes place. In this case, a process time for changing the temperature temporarily is eliminated and an overall process time of an ALD process is shortened further.

The deposition of a chemical precursor compound may involve a nucleation step. In this case, in a first step of deposition on the substrate surface which is to be covered by the chemical precursor compound, individual sections of the precursor compound which has been deposited and may have been modified are formed. In a second step, further fractions of the chemical precursor compound are deposited preferentially and directly in the vicinity of the fractions (nuclei) which have already been deposited. The second deposition step can generally take place at a significantly lower temperature than the preceding nucleation step. Then, to deposit a chemical precursor compound in this way, it is sufficient for the substrate surface to be heated to a high temperature, which allows the nucleation to take place, only for a sufficiently long nucleation phase. For the second step, i.e. the completion of the deposition, the temperature is significantly reduced again, with the result that a more homogeneous layer structure and a reduced roughness of the layers produced is achieved and, moreover, the thermal load on the substrate is significantly reduced.

In a further preferred embodiment of the invention, the process is used to activate reactants or the substrate surface. In this case, the substrate surface is chemically activated by brief, rapid heating. The activation allows subsequent deposition of a chemical precursor compound. This obviates the need for the substrate surface to be activated by means of plasma processes. In plasma processes of this type, an electromagnetic alternating field is generated in the vicinity of the substrate surface with the aid of electrodes. For its part, the electromagnetic alternating field generates a chemically highly reactive ion gas. Particularly in the case of deposition on thin dielectric layers, the substrate surface is damaged very easily, in particular if the highly reactive ion gas is produced very close to the substrate surface. The electrodes are therefore to be provided at a sufficient distance from the substrate surface for plasma processes. This is in addition to the space required for the actual electrodes themselves and a reaction space located between the electrodes. A chamber volume of an optimum process chamber for plasma-enhanced deposition processes is therefore large compared to that of an optimum process chamber for ALD processes, since the smallest possible chamber volume is desired in ALD processes, in order to accelerate the process.

Therefore, to optimize a plasma process, there are demands imposed on a process chamber which are contrary to an optimum ALD process chamber.

In the case of the deposition of nitride and oxide layers, the nitrogen and oxygen content of the compounds deposited are highly dependent on the process conditions. Nitrogen or oxygen is expelled from such layers by means of subsequent temperature changes (also referred to below as temperature steps), and as a result the chemical homogeneity of the layer is increased. The layer is during these steps subject to shrinkage, which under extreme circumstances may even lead to a layer which has previously been deposited in continuous form being destroyed. An improvement to a layer of this type is achieved by sequential deposition of thin layers of nitride or oxygen in each case followed by temperature steps in an inert gas atmosphere. For this purpose, it has hitherto been necessary for the substrate to be removed from the ALD process chamber and placed in an RTP reactor in which the temperature step is carried out. According to a preferred embodiment of the process according to the invention, therefore, a layer comprising one monolayer or a plurality of monolayers is deposited on a substrate surface, and the layer is then treated by a rapid, brief and significant temperature increase (in situ anneal.). In this way, it is possible, in a particularly simple way, to break down mechanical stresses in the layer which has been deposited, to reduce chemical and stoichiometric inhomogeneities and to harden the layer material.

It is preferable for the material of the monolayer in this case to be tungsten nitride. Particularly for deposition of a tungsten nitride layer using an ALD process, the nitrogen content of the layer is highly dependent on the process conditions and fluctuates between that of a layer of pure WN and that of a layer of pure $W_2N$. If, following the deposition of a tungsten nitride layer composed of a plurality of monolayers, in a required layer thickness, a temperature step is then carried out in the customary way, so that nitrogen is expelled from the layer, the tungsten nitride layer is subject to shrinkage on account of the nitrogen loss, and this can lead to homogeneities or under extreme circumstances even to holes in the layer. According to the process according to the invention, after in each case one or a plurality of tungsten nitride monolayers has/have been deposited, in each case an intervening temperature step in an inert gas atmosphere is carried out, so that the expulsion of the nitrogen takes place at smaller layer thicknesses and is therefore more controlled and more uniform. Fewer inhomogeneities are formed. Should such inhomogeneities or, for example, holes nevertheless form, they are at least partially compensated for again or filled up during deposition of the next monolayers, so that in the case of deposition of thin tungsten nitride layers the advantages of the process according to the invention become especially effective.

Particularly if the tungsten nitride layer is produced from the chemical precursor compounds tungsten hexafluoride and ammonia, monolayers with a fluctuating nitrogen content are formed. The introduction and deposition of the tungsten hexafluoride and of the ammonia take place at a temperature of approximately 400° C.

In a temperature step which follows deposition of one or a plurality of monolayers, it is preferable for the temperature on the substrate surface to be set to a temperature of between 800 and 1000° C., preferably to 900° C., for at least 15 and at most 120 seconds.

In a further particularly preferred embodiment of the invention, the deposition of each or a plurality of layers or monolayers is followed by rapid and brief heating of the substrate surface in order to vaporize impurities (in situ clean). In this way, the contamination of the chamber interior and therefore a defect density in the deposited layers are reduced particularly quickly and easily.

In all the abovementioned processes, it is advantageous if the substrate can remain in the ALD process chamber for the temperature steps. In this way, in particular surface contamination and unproductive set-up times are avoided.

In a further preferred embodiment of the process according to the invention, nanolaminates are produced in a particularly advantageous way on a substrate surface. In this context, the term nanolaminate denotes a stack comprising a plurality of successive layers, which are each only a few nanometers thick and are made from at least two different layer materials. The advantages of the process according to the invention in the production of nanolaminates results from different optimum temperature ranges for the deposition of the two layer materials. Since the process according to the invention allows the temperature of the substrate surface to be matched particularly accurately and quickly to the temperature range which is optimum for a process step which is in each case about to be carried out, the result is a particularly great time saving in the production of nanolaminates using the process according to the invention.

A combination of deposition processes with temperature steps for an anneal which changes the chemical and/or physical structure of a layer which has been deposited in a single process chamber and a sequential deposition of layers made from different layer materials at different temperatures are also particularly advantageous in connection with CVD processes. Processes of this type are advantageous in particular for deposition on planar substrate surfaces which are not structured or are only relatively gently structured and for which a high edge coverage is not required.

Therefore, it is also an object of the invention to provide a process in which, in each case compared to a standard CVD process, the speed at which a layer is deposited in a CVD process is increased and/or the quality of a layer deposited in a CVD process is improved.

This object is achieved by a process for depositing a layer made from a layer material on at least sections of a substrate surface of a substrate arranged in a process chamber, in which at least one chemical precursor compound of a layer material is introduced in a vapor phase into the process chamber, and the layer material is formed from the precursor compounds in a chamber interior of the process chamber and, at least in section, is deposited on the substrate surface and/or the layer material forms on the substrate surface, and during and/or after the deposition of the layer material at least one temperature change is carried out on the substrate surface with a gradient of greater than 100 Kelvin per second.

In this way, it is possible to subject layers which have been deposited particularly economically by means of a CVD process to an anneal which changes the chemical and/or physical structure of the layers which have been deposited. Since the process according to the invention allows the duration of the anneal to be matched to the thickness of the layer which has been deposited and is to be subjected to an anneal, the result is a further process parameter for optimizing the speed and quality of deposition.

The process according to the invention is particularly advantageously used to deposit silicide layers by means of a CVD process in a known way and then to subject them to a temperature step for the purpose of annealing in the same process chamber. The anneal leads to recrystallization of the silicide layer which has been deposited and to a stoichiometrically homogeneous silicide layer.

The invention is also advantageous for the deposition of a layer stack in which layers of at least two different layer materials are arranged in succession, the layer materials being deposited in each case at different temperatures of the substrate or substrate surface.

Therefore, the process according to the invention allows economical production of layer stacks of this type.

If the layer materials of a layer stack of this type are, for example, polysilicon and tungsten silicide, optimized deposition of the polysilicon takes place in a temperature range between 600° C. and 700° C., while the tungsten silicide is preferably deposited at a temperature of less than 500° C.

Other features which are considered as characteristic for the invention are set forth in the appended claims.

Although the invention is illustrated and described herein as embodied in device and process for depositing thin layers by means of ALD/CVD processes in combination with rapid thermal processes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing and examples.

BRIEF DESCRIPTION OF THE DRAWING

The FIGURE is a diagrammatic cross section through a process chamber according to the invention.

DESCRIPTION OF THE PREFERRED EMBODIMENTS

Referring now to the sole FIGURE of the drawing in detail there is shown a process reactor in which a chamber wall 4 of a process chamber 1 surrounds a chamber interior 5. Inside the chamber interior 5 there is disposed a substrate 3, typically a semiconductor wafer, on a holding device 2.

The process chamber 1 also has feed and discharge devices 6, by means of which chemical precursor compounds of a layer material are introduced into the process chamber 1 and undeposited fractions of the chemical precursor are removed again. Furthermore, the chamber wall 4 of the process chamber 1 has at least one transparent section 7, which lies opposite a substrate surface 8 of the substrate 3 on which a layer of the layer material is deposited using an ALD process. Heat radiation 10 from a radiation source 9, which is arranged outside the chamber interior 5, is transmitted to the substrate surface 8 through the transparent section 7 of the chamber wall 4. The substrate 3 is introduced to the process chamber 1 via a substrate feed device 11.

EXAMPLE 1

With the process according to the invention, the production of nanolaminates comprising $HfO_2/SiO_2$ layers can be carried out, for example, in the following process steps:

A1 setting the temperature on the substrate surface to 500° C, adding the first chemical precursor compound of the first monolayer, $HfCl_4$, reaction time 500 ms (100 to 10000 ms);

A2 filling the process chamber with an inert gas ($N_2$ or argon) for 1000 ms (100 to 10000 ms);

A3 adding a second chemical precursor compound of the first monolayer ($H_2O$), reaction time 2500 ms (100 to 10000 ms); this is followed by the reaction of the two chemical precursor materials in accordance with the following reaction $HfCl_4 + 2H_2O \rightarrow 4HfO_2 + 4HCl$;

this reaction is described by M. Ritala et al. in *Thin Solid Films* 250 (1994) 72;

A4 filling the process chamber with an inert gas ($N_2$ or argon) for 3000 ms (200 to 10000 ms) and, at the same time, reducing the temperature of the substrate surface to 427° C.;

B1 adding a first chemical precursor compound of the second monolayer, $SiCl_4$, reaction time 200 ms (100 to 10000 ms)

B2 purging the process chamber with an inert gas (N$_2$ or argon) for 1000 ms (100 to 10000 ms);

B3 adding a second chemical precursor compound of the second monolayer, H$_2$O, reaction time 500 ms (100 to 10000 ms);

The deposition of SiO$_2$ from SiCl$_4$ and H$_2$O takes place according to the following reaction $$SiCl_4 + 2H_2O \rightarrow 4SiO_2 + 4HCl$$

and is described by J. Klaus et al. in *Applied Physics Letters* 70 (1997) 1092.

B4 purging the process chamber with an inert gas (N$_2$ or argon) for 2 500 ms (100 to 10 000 ms) and, at the same time, heating the substrate to 500° C.

A cycle A, which comprises process steps A1 to A4, describes the deposition of hafnium oxide, and a cycle B, which comprises the process steps B1 to B4, describes the deposition of silicon oxide. The ratio of hafnium oxide to silicon oxide in the nanolaminate is determined by the number of the respective cycles A and B. If, in the example, 6 cycles A and then 6 cycles B are carried out, the result is a hafnium oxide to silicon oxide ratio of 1:1. Equally, it is possible to produce nanolaminates with in each case different thicknesses of the monolayers, for example by using 12 successive cycles A followed by 6 successive cycles B.

EXAMPLE 2

The process according to the invention can be used to deposit a layer of tungsten nitride, for example in the following way:

A1 setting a temperature of 400° C. on the substrate surface, adding a first chemical precursor compound of tungsten nitride, tungsten hexafluoride (WF$_6$), reaction time 400 ms (100 to 10000 ms);

A2 purging the process chamber with an inert gas (N$_2$ or argon) for 1500 ms; (100 to 10000 ms);

A3 adding a second chemical precursor compound of tungsten nitride, ammonia (NH$_3$), reaction time 2500 ms (100 to 10000 ms);

A4 purging the process chamber with an inert gas (N$_2$ or argon) for 3000 ms (200 to 10000 ms);

B1 increasing the temperature on the substrate surface to 900° C. (600 degrees to 1000 degrees) for 60 seconds (15 to 120 seconds)

B2 cooling the substrate surface to the original process temperature of 400° C.

An anneal step which comprises steps B1 and B2 takes place in an inert gas atmosphere and is carried out after each cycle A1 to A4 or after a plurality of cycles A1 to A4.

EXAMPLE 3

The production of WSix and Wsix-containing layer stacks using the process according to the invention can be carried out, for example, in the following way:

Thin layers of WSix, which are from two to twenty nanometers thick, are deposited in a CVD process from the chemical precursor compounds WF$_6$ and dichlorosilane at a substrate surface temperature of between 450° C. and 500° C. Then, the supply of the chemical precursor compounds is stopped and an inert atmosphere is created in the process chamber as a result of exclusively the inert carrier gas argon being supplied. This is followed by a temperature step for a rapid thermal anneal, the duration of which increases as the layer becomes thicker. This results in different durations for the anneal for different annealing temperatures:

a) a duration of 30 to 300 seconds for an annealing temperature of 650° C.
b) 200 to 300 seconds for 750° C.
c) 15 to 240 seconds for 900° C.
d) 10 to 180 seconds for 1000° C.
e) 10 to 120 seconds for 1100° C.

A cycle comprising deposition and anneal is repeated until the desired layer thickness and quality has been reached.

EXAMPLE 4

The production of a layer stack comprising WSix and polysilicon can be carried out using the process according to the invention, for example in the following way:

a) The deposition of polysilicon takes place at a temperature of 600° C. to 700° C. in a CVD process chamber, the chemical precursor compound used being silane and argon being used as the carrier and/or shielding gas.

b) The deposition of WSix takes place at a temperature of less than 550° C. using the process gases WF$_6$ and dichlorosilane. In this case too, the inert gas used is argon.

The deposition cycles for polysilicon and WSix are repeated until a stack having the desired layer thickness is produced. By suitably adapting the gas flow rates and temperatures, it is possible to set the deposition rates in such a way that layer thicknesses of between 5 and 30 nanometers are deposited within time periods of, for example, 15 seconds.

We claim:

1. A method of depositing a layer material on a substrate surface, which comprises the following method steps:

(a) introducing a first chemical precursor compound of the layer material in vapor phase into a process chamber, depositing and chemically bonding a first fraction of the first chemical precursor compound on the substrate surface at least in sections to form a monomolecular partial monolayer;

(b) removing undeposited second fractions of the first chemical precursor compound from the process chamber;

(c) introducing a second chemical precursor compound of the layer material in vapor phase into the process chamber, depositing and chemically bonding a first fraction of the second chemical precursor compound on the sections of the substrate surface covered by the first chemical precursor compound, and thereby forming a monolayer comprising the layer material of the first and second chemical precursor compounds; and (d) removing undeposited second fractions of the second chemical precursor compound from the process chamber;

and thereby:

repeating steps (a) to (d) to produce a layer from successive monolayers;

subjecting the substrate surface to at least one temperature change with a gradient of greater than 100 Kelvin per second in the process chamber selectively before, during, and/or after at least one process step;

heating and activating the substrate surface by a rapid and brief increase in the temperature prior to depositing a chemical precursor compound, subsequently reducing a temperature of the substrate surface and depositing the chemical precursor compound on the activated substrate surface.

2. The method according to claim 1, which comprises:
introducing and depositing the first chemical precursor compound at a first temperature of the substrate surface; and
introducing and depositing the second chemical precursor compound at a second temperature of the substrate surface different from the first temperature.

3. The method according to claim 2, which comprises removing the undeposited second fractions of at least one of the first and second chemical precursor compounds by purging the process chamber with the respectively other chemical precursor compound at a temperature TA at which the other chemical precursor compound is inert.

4. The method according to claim 3, which comprises keeping the temperature TA equal to one of the first and second temperature at which in each case the other chemical precursor compound is introduced and deposited.

5. The method according to claim 1, wherein the step of introducing and depositing at least one of the first and second chemical precursor compounds comprises the following steps:
(a) establishing a nucleation temperature TN on the substrate surface;
(b) depositing first sections of the chemical precursor compound in a nucleation step;
(c) reducing the temperature on the substrate surface to above a minimum completion temperature TK; and
(d) depositing second sections of the precursor compound.

6. The method according to claim 1, which comprises, after depositing a layer comprising one monolayer, briefly heating the substrate surface by a rapid temperature change, to thereby change at least one of a chemical structure and a physical structure of the layer.

7. The method according to claim 1, which comprises, after to depositing a layer comprising a plurality of monolayers, briefly heating the substrate surface by a rapid temperature change, to thereby change at least one of a chemical structure and a physical structure of the layer.

8. The method according to claim 1, which comprises forming the layer of tungsten nitride.

9. The method according to claim 8, which comprises introducing tungsten hexafluoride into the process chamber as the first chemical precursor compound of tungsten nitride, and introducing ammonia into the process chamber as the second chemical precursor compound.

10. The method according to claim 9, which comprises setting a temperature on the substrate surface during the introduction and deposition of the tungsten hexafluoride and of the ammonia to substantially 400° C. (±10%), and which further comprises changing at least one of a chemical structure and a physical structure of one monolayer or a plurality of monolayers by setting the temperature to at least 800° C. for at least 15 and at most 120 seconds, and thereby changing the temperature with a gradient of greater than 100 Kelvin per second.

11. The method according to claim 1, which comprises thermally decomposing impurities formed in a chamber interior of the process chamber during the production of the layers by a rapid and brief increase in the temperature and removing the impurities from the process chamber.

12. The method according to claim 1, which comprises depositing a plurality of successive layers each comprising one of at least two different layer materials, and depositing the various layer materials at different temperatures on the substrate surface.

13. The method according to claim 12, wherein the first layer material deposited is $HfO_2$ at a temperature of substantially 500° C. (±10%) from the precursor compounds $HfCl_4$ and $K_2O$, and the second layer material deposited is $SiO_2$ at a temperature of substantially 427° C. (±10%) from the precursor compounds $SiCl_4$ and $H_2O$, to thereby produce a nanolaminate, formed from successive layers of $HfO_2$ and $SiO_2$.

* * * * *